(12) United States Patent
Kang et al.

(10) Patent No.: US 11,587,874 B2
(45) Date of Patent: Feb. 21, 2023

(54) RESISTANCE REDUCTION FOR WORD LINES IN MEMORY ARRAYS

(71) Applicant: Intel Corporation, Santa Clara, CA (US)

(72) Inventors: Sung-Taeg Kang, Palo Alto, CA (US); Pranav Kalavade, San Jose, CA (US); Owen W. Jungroth, Sonora, CA (US); Prasanna Srinivasan, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 16/799,448

(22) Filed: Feb. 24, 2020

(65) Prior Publication Data

US 2021/0265278 A1 Aug. 26, 2021

(51) Int. Cl.
| | |
|---|---|
| *H01L 27/11556* | (2017.01) |
| *H01L 27/11582* | (2017.01) |
| *H01L 23/532* | (2006.01) |
| *H01L 21/3205* | (2006.01) |
| *H01L 21/768* | (2006.01) |
| *H01L 23/528* | (2006.01) |

(52) U.S. Cl.
CPC .. *H01L 23/53271* (2013.01); *H01L 21/32055* (2013.01); *H01L 21/76892* (2013.01); *H01L 23/528* (2013.01); *H01L 23/53266* (2013.01); *H01L 27/11556* (2013.01); *H01L 27/11582* (2013.01)

(58) Field of Classification Search
CPC ............. H01L 23/53271; H01L 23/528; H01L 21/76892; H01L 27/11556; H01L 23/53266; H01L 27/11582; H01L 21/32055; H01L 27/1157; H01L 27/11524; H01L 27/11573; H01L 27/11565; H01L 27/11526; H01L 27/11519

See application file for complete search history.

(56) References Cited

U.S. PATENT DOCUMENTS

| | | | |
|---|---|---|---|
| 9,735,202 B1 | 8/2017 | Tanaka et al. | |
| 10,312,251 B2* | 6/2019 | Sonehara | H01L 27/11582 |
| 11,081,494 B2* | 8/2021 | Fujita | H01L 27/11582 |
| 2012/0146122 A1 | 6/2012 | Whang et al. | |
| 2013/0043509 A1 | 2/2013 | Cho et al. | |
| 2014/0063890 A1* | 3/2014 | Lee | H01L 27/11524 365/63 |
| 2014/0203346 A1* | 7/2014 | Lee | H01L 27/11565 257/324 |

OTHER PUBLICATIONS

Extended European Search Report dated May 4, 2021 for EP Application No. 20208294.7, 10 pages.

* cited by examiner

*Primary Examiner* — David Vu
(74) *Attorney, Agent, or Firm* — Schwabe, Williamson & Wyatt, P.C.

(57) ABSTRACT

Apparatus, systems, or methods for a memory array having a plurality of word lines. A word line includes at least one word line plate, and the word line plate comprises a first material with a first resistivity. An edge of the word line plate is recessed and filled with a second material having a second resistivity that is lower than the first resistivity. As a result, the total resistance of the word line may be reduced compared to a word line using only the first material with the first resistivity. Other embodiments may also be described and claimed.

19 Claims, 8 Drawing Sheets

RESISTANCE REDUCTION FOR WORD LINES IN MEMORY ARRAYS

FIELD

Embodiments of the present disclosure relate generally to the technical fields of computing devices, and more particularly to the memory devices.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Memory devices are important parts of integrated circuits (IC) and modern electronic devices. A typical memory device, e.g., a flash memory device or a dynamic random access memory (DRAM), comprise a memory array that includes a large number of memory cells arranged in row and column fashion controlled by word lines and bit lines, where data may be stored in the memory cells. However, current memory array architecture may have high word line (WL) resistance, which may result in technological restrictions on the memory structures occupying a particular die area.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments herein include a memory array having a plurality of word lines. A word line includes at least one word line plate, and the word line plate comprises a first material with a first resistivity. An edge of the word line plate is recessed and filled with a second material having a second resistivity that is lower than the first resistivity. As a result, the total resistance of the word line may be reduced compared to a word line using only the first material with the first resistivity.

Embodiments herein include a method for forming a memory array. The method includes forming a plurality of word lines. A word line includes at least a word line plate comprising a first material with a first resistivity. The method further includes forming a recess along an edge of the word line plate; and filling the recess with a second material having a second resistivity that is lower than the first resistivity. As a result, the total resistance of the word line may be reduced compared to a word line using only the first material with the first resistivity.

Embodiments herein include a computing device. The computing device includes one or more processors, and a memory array attached to the one or more processors. The memory array includes a plurality of word lines. A word line includes at least one word line plate, and the word line plate comprises a first material with a first resistivity. An edge of the word line plate is recessed and filled with a second material having a second resistivity that is lower than the first resistivity. As a result, the total resistance of the word line may be reduced compared to a word line using only the first material with the first resistivity.

Memory devices are important parts of integrated circuits (IC), computing devices, or modern electronic devices. Nonvolatile memory, such as NAND based flash memory, has become a widely used storage memory for various devices and systems. A memory device comprise a memory array that includes a large number of memory cells arranged in row and column fashion controlled by word lines (WL) and bit lines, where data may be stored in the memory cells. However, in current technology, word lines may have high resistances, which may restrict the length of WL, resulting in die area penalty, frequent WL chopping, more staircases and block separations. When a word line includes polysilicon, in order to reduce the resistance of the polysilicon, increasing polysilicon dopants or silicidation of polysilicon may be used. However, increasing dopants in polysilicon for a word line may not be enough to lower its resistance to impact die area to a desired size. In addition, increasing dopants in polysilicon may make it difficult to control uniform dielectric growth for the memory cells. Silicidation of polysilicon is also self-limited, resulting in more word line plate separation and larger die size to expose the polysilicon to be silicided.

Embodiments described herein use a word line plate including two different materials with two different resistivity. For example, the word line plate comprises a first material with a first resistivity, and a second material having a second resistivity that is lower than the first resistivity, to reduce total resistance of the word line. The second material may be placed along an edge of the first material. The first material may include polysilicon, and the second material may include a metal, e.g., W, Mo, Ti, TiN, or other metals. Such word lines may be applied to many different kinds of memory array architecture, e.g., a 2 dimensional NAND memory array, a 3 dimensional NAND memory array, some other flash memory device, or other memory devices. Embodiments herein also include processes for making such a memory array with word lines. The process includes shunting low resistive material to an edge of a polysilicon word line plate. At the edge of a word line plate, metallic material can be detected, while the polysilicon part of the word line may be inside the memory array block. By using metallic material along an edge of a word line plate, the word line may have reduced RC delays. Accordingly, the reduced RC delay allows extended word line length and reduced die size scaling by eliminating staircase, or memory block to block separation area. As a further result, the number of drain-side select gate (SGD) or source-side select gate (SSG) may be reduced as well.

In the description to follow, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrase "A or B" and "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

As used herein, the term "circuitry" may refer to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD), (for example, a field-programmable gate array (FPGA), a programmable logic device (PLD), a complex PLD (CPLD), a high-capacity PLD (HCPLD), a structured ASIC, or a programmable System on Chip (SoC)), digital signal processors (DSPs), etc., that are configured to provide the described functionality. In some embodiments, the circuitry may execute one or more software or firmware programs to provide at least some of the described functionality.

As used herein, the term "processor circuitry" may refer to, is part of, or includes circuitry capable of sequentially and automatically carrying out a sequence of arithmetic or logical operations; recording, storing, and/or transferring digital data. The term "processor circuitry" may refer to one or more application processors, one or more baseband processors, a physical central processing unit (CPU), a single-core processor, a dual-core processor, a triple-core processor, a quad-core processor, and/or any other device capable of executing or otherwise operating computer-executable instructions, such as program code, software modules, and/or functional processes.

As used herein, the term "computer device" or "computing device" may describe any physical hardware device capable of sequentially and automatically carrying out a sequence of arithmetic or logical operations, equipped to record/store data on a machine readable medium, and transmit and receive data from one or more other devices in a communications network. A computer device may be considered synonymous to, and may hereafter be occasionally referred to, as a computer, computing platform, computing device, etc. The term "computer system" may include any type of interconnected electronic devices, computer devices, or components thereof. Additionally, the term "computer system" and/or "system" may refer to various components of a computer that are communicatively coupled with one another. Furthermore, the term "computer system" and/or "system" may refer to multiple computer devices and/or multiple computing systems that are communicatively coupled with one another and configured to share computing and/or networking resources. Examples of "computer devices", "computer systems", etc. may include cellular phones or smart phones, feature phones, tablet personal computers, wearable computing devices, an autonomous sensors, laptop computers, desktop personal computers, video game consoles, digital media players, handheld messaging devices, personal data assistants, an electronic book readers, augmented reality devices, server computer devices (e.g., stand-alone, rack-mounted, blade, etc.), cloud computing services/systems, network elements, in-vehicle infotainment (IVI), in-car entertainment (ICE) devices, an Instrument Cluster (IC), head-up display (HUD) devices, onboard diagnostic (OBD) devices, dashtop mobile equipment (DME), mobile data terminals (MDTs), Electronic Engine Management Systems (EEMSs), electronic/engine control units (ECUs), vehicle-embedded computer devices (VECDs), autonomous or semi-autonomous driving vehicle (hereinafter, simply ADV) systems, in-vehicle navigation systems, electronic/engine control modules (ECMs), embedded systems, microcontrollers, control modules, engine management systems (EMS), networked or "smart" appliances, machine-type communications (MTC) devices, machine-to-machine (M2M), Internet of Things (IoT) devices, and/or any other like electronic devices. Moreover, the term "vehicle-embedded computer device" may refer to any computer device and/or computer system physically mounted on, built in, or otherwise embedded in a vehicle.

FIGS. 1($a$)-1($d$) illustrate an example apparatus including a memory array 100 having a plurality of word lines, in accordance with various embodiments. The memory array 100 may be a part of a 3D NAND flash memory, a three dimensional double density flash memory, a vertical flash memory, or a horizontal flash memory. The memory array 100 is only for illustration, and is not limiting. For example, there may be another memory array that is a two dimensional NAND flash memory array having a plurality of word lines.

In embodiments, as shown in FIG. 1($a$), the memory array 100 includes multiple conductive layers to function as word lines, e.g., a word line 101, a word line 103. Insulation layers, e.g., an insulation layer 102, such as an oxide, are positioned between the word lines. There may be more than two word lines in a memory array. The word lines and the insulation layers may be placed in a first direction, e.g., the Y direction. In embodiments, a slit 107 splits each word line, e.g., the word line 101, the word line 103, into two word line regions. For example, the word line 101 is split by the slit 107 into a region 111 and a region 113. There is a layer 105 below the word line 103 and separated from the word line 103 by an insulation layer 104. The layer 105 may include a source side select (SGS) transistor, which may be referred to as a source select gate (SSG), coupled to a source line. There may be a drain side select (SGD) transistor, which may be referred to as a drain select gate, not shown, above the word line 101. The slit 107 may be filled with an insulating material, not shown. In some embodiments, there may not be any slit.

Figure 1A:
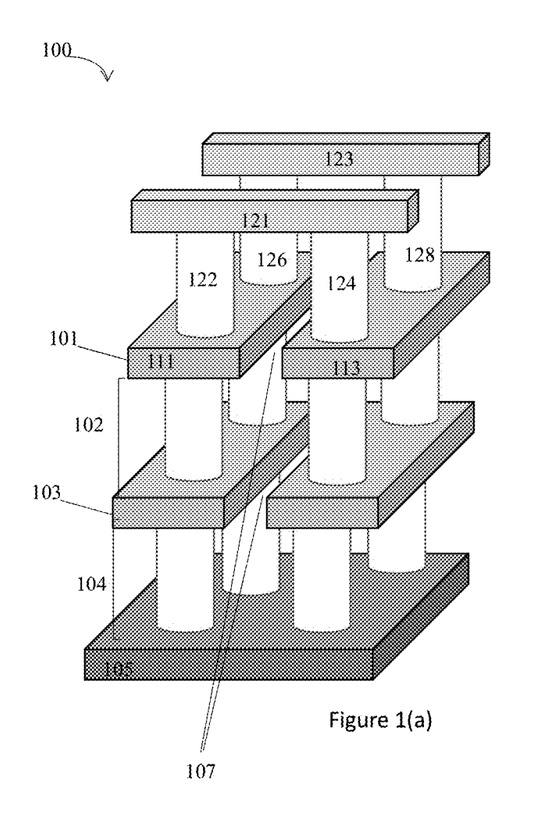
FIGS. 1(a)-1(d) illustrate an example apparatus including a memory array having a plurality of word lines, in accordance with various embodiments.
Figure 1B:
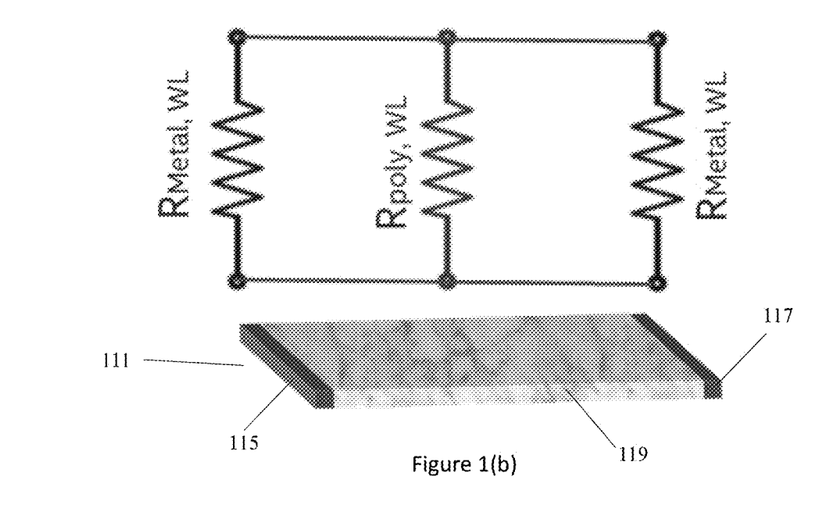

In embodiments, the word line 101 includes multiple word line plates, e.g., a word line plate for the region 111, and a word line plate for the region 113. As shown in FIG. 1(b), the word line plate for the region 111 may include a first material 119 with a first resistivity, and a second material 115 having a second resistivity that is lower than the first resistivity. The second material 115 may be formed along an edge of the first material 119. In addition, the second material 115 is also disposed at an edge of the slit 107. For example, an edge of the word line plate for the region 111 is recessed and filled with the second material 115. In some embodiments, there may be another material 117 along another side of the first material 119. Since the resistivity of the material 117 or the second material 115 is smaller than the resistivity of the first material 119, the total resistance of the word line region 111 may be reduced, compared to a word line region using only the first material.

As shown in FIG. 1(b), the total resistance of the word line region 111 is a result of three parallel resistances, i.e., for the first material 119, the resistance for the second material 115, and a resistance of the material 117. The material 117 may be a same material as the second material 115, or a different material. In some embodiments, the first material includes polysilicon, and the second material includes a metal material, e.g., W, Ti, TiN, Mo, or other metals. In some embodiments, there may only two different materials, the first material 119 and the second material 115, without the material 117.

For the example shown in FIG. 1(b), the total resistance of the word line plate having the second material 115 and the material 117 on two sides of the first material 119 can be about 4 times lower than a word line plate including only polysilicon. Accordingly, with a same RC, a word line plate as shown in FIG. 1(b) can have about twice length of a word line plate with only polysilicon.

One or more pillars, e.g., a pillar 122, a pillar 124, a pillar 126, and a pillar 128, may be disposed through the plurality of word lines along a second direction orthogonal to the first direction, e.g., the Z direction. In some embodiments, a pillar may be referred to as a string. The memory array 100 further includes a plurality of bit lines, e.g., a bit line 121, a bit line 123, coupled to the plurality of pillars in a direction, e.g., the X direction, orthogonal to the plurality of word lines and the plurality of pillars. A pillar may be an active pillar including a number of storage cells, or a dummy pillar that does not include a storage cell. The storage cells of the pillars, e.g., the pillar 122, are selected by drain select gates to connect to the bit lines for read and write operations.

Figure 1C:
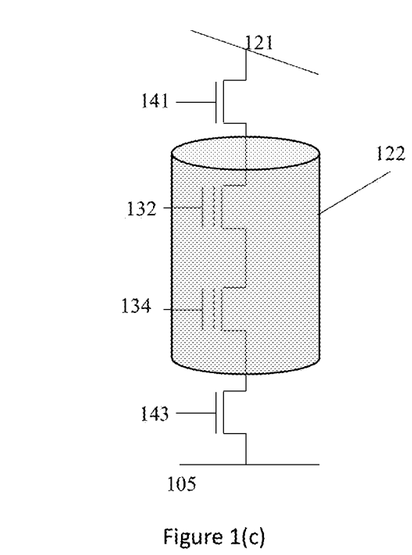

For example, as shown in FIG. 1(c), the pillar 122 may include a storage cell 132 at the intersection of the word line 101 and the pillar 122, and a storage cell 134 at the intersection of the word line 103 and the pillar 122. The pillar 122 is coupled to the bit line 121 through a drain select gate 141, and coupled to the source select gate 143 and further coupled to the source line 105.

Figure 1D:
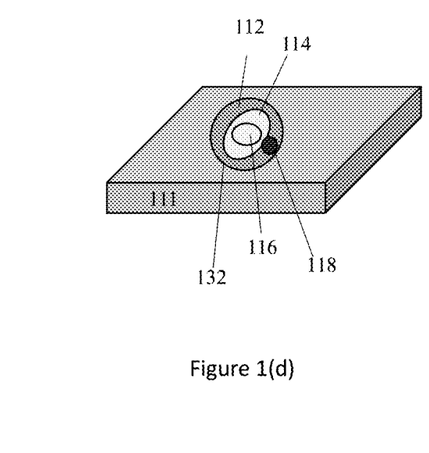

Each storage cell is formed at the intersection of a WL and an active pillar. For example, as shown in FIG. 1(d), the storage cell 132 is formed at the intersection of the word line 101 and the pillar 122. The storage cell 132 may include a floating gate transistor. The storage cell 132 includes a channel trapping layer 112 surrounded by the word line 101, and a cell channel region 114 surrounded by the channel trapping layer 112. The channel trapping layer 112 may include an oxide-nitride-oxide (ONO) material. In some embodiments, there may be an oxide material 116 surrounded by the cell channel region 114. Some of the pillars, e.g., the pillar 128, may be a dummy pillar disposed through the plurality of word lines, where the dummy pillar 128 does not include a storage cell.

In some embodiments, the storage cell 132 may represent one-bit data 118 for a single-level-cell (SLC) structure. In some other embodiments, the storage cell 132 may also have multiple-level-cell (MLC) structures or triple-level-cell (TLC) structures that store 2 or 3 bits, respectively, at each cell. As shown in FIG. 1(a), the slit 107 splits each word line into two regions coupled to the same bit line. This allows for each cell to store double the data. In general, a slit separates the plurality of word lines into a first word line region and a second word line region, and storage cells within the first word line region forms a first memory block, and storage cells within the second word line region forms a second memory block.

FIGS. 2(a)-2(d) illustrate example memory arrays, e.g., a memory array 200, a memory array 210, a memory array 220, and a memory array 230, having a plurality of word lines, in accordance with various embodiments. The memory array 200, the memory array 210, the memory array 220, and the memory array 230 may be an example of the memory array 100 as shown in FIG. 1(a).

Figure 2A:
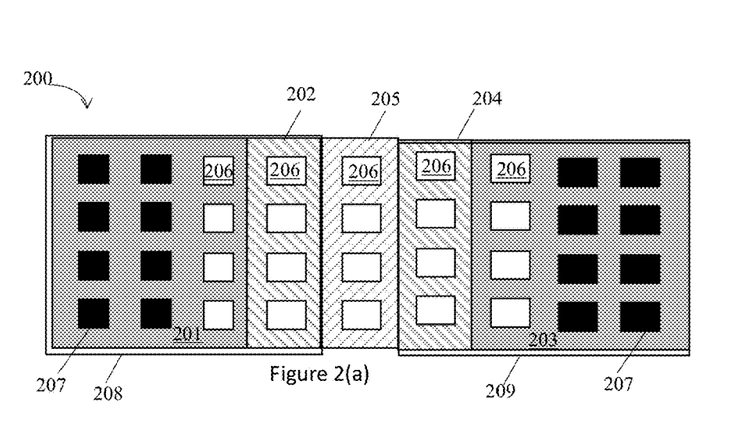
FIGS. 2(a)-2(d) illustrate example memory arrays having a plurality of word lines, in accordance with various embodiments.

In embodiments, as shown in FIG. 2(a), the memory array 200 includes a word line plate 208 and a word line plate 209, separated by a slit 205. The word line plate 208 intersect with a plurality of pillars 207 in an orthogonal direction, and the word line plate 209 intersect with a plurality of pillars 207 in an orthogonal direction as well. The word line plate 208 includes a first material 201 with a first resistivity and a second material 202 with a second resistivity smaller than the first resistivity, and the word line plate 209 includes a first material 203 with a first resistivity and a second material 204 with a second resistivity smaller than the first resistivity. The second material 202 is along an edge of the first material 201, and is also disposed at an edge of the slit 205. The second material 204 is along an edge of the first material 203, and is also disposed at an edge of the slit 205. A plurality of dummy pillars, e.g., dummy pillar 206, are disposed in the first material 201, the second material 202, the first material 203, the second material 204, and the slit 205.

Figure 2B:
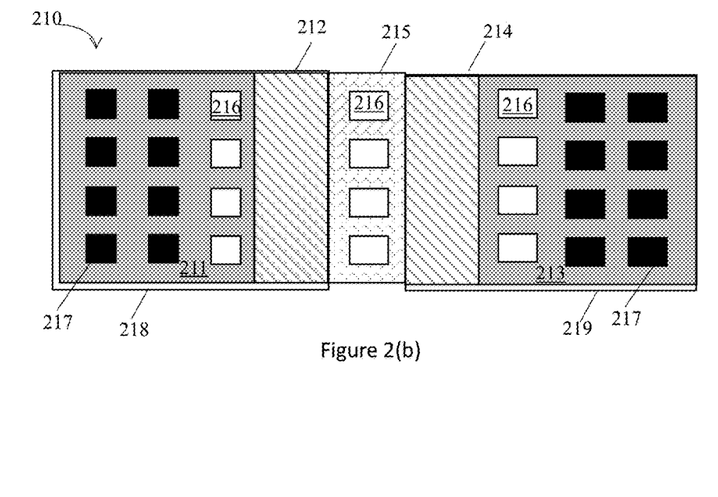
Figure 2C:
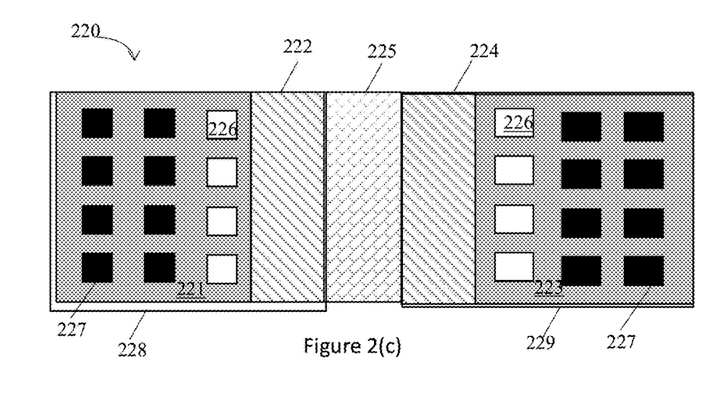
Figure 2D:
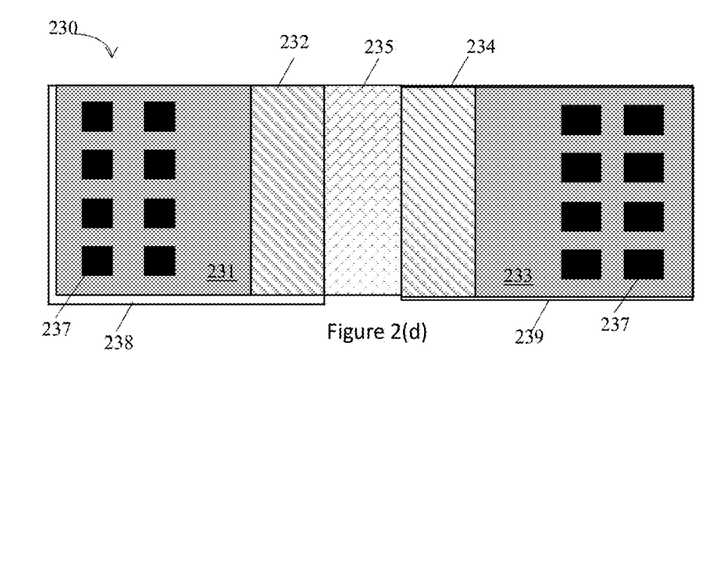

In embodiments, as shown in FIG. 2(b), the memory array 210 includes a word line plate 218 and a word line plate 219, separated by a slit 215. The word line plate 218 intersect with a plurality of pillars 217 in an orthogonal direction, and the word line plate 219 intersect with a plurality of pillars 217 in an orthogonal direction as well. The word line plate 218 includes a first material 211 with a first resistivity and a second material 212 with a second resistivity smaller than the first resistivity, and the word line plate 219 includes a first material 213 with a first resistivity and a second material 214 with a second resistivity smaller than the first resistivity. The second material 212 is along an edge of the first material 211, and is also disposed at an edge of the slit 215. The second material 214 is along an edge of the first material 213, and is also disposed at an edge of the slit 215. A plurality of dummy pillars, e.g., dummy pillar 216, are disposed in the first material 211, the first material 213, and the slit 215.

In embodiments, as shown in FIG. 2(*c*), the memory array 220 includes a word line plate 228 and a word line plate 229, separated by a slit 225. The word line plate 228 intersect with a plurality of pillars 227 in an orthogonal direction, and the word line plate 229 intersect with a plurality of pillars 227 in an orthogonal direction as well. The word line plate 228 includes a first material 221 with a first resistivity and a second material 222 with a second resistivity smaller than the first resistivity, and the word line plate 229 includes a first material 223 with a first resistivity and a second material 224 with a second resistivity smaller than the first resistivity. The second material 222 is along an edge of the first material 221, and is also disposed at an edge of the slit 225. The second material 224 is along an edge of the first material 223, and is also disposed at an edge of the slit 225. A plurality of dummy pillars, e.g., dummy pillar 226, are disposed in the first material 221 and the first material 223.

In embodiments, as shown in FIG. 2(*d*), the memory array 230 includes a word line plate 238 and a word line plate 239, separated by a slit 235. The word line plate 238 intersect with a plurality of pillars 237 in an orthogonal direction, and the word line plate 239 intersect with a plurality of pillars 237 in an orthogonal direction as well. The word line plate 238 includes a first material 231 with a first resistivity and a second material 232 with a second resistivity smaller than the first resistivity, and the word line plate 239 includes a first material 233 with a first resistivity and a second material 234 with a second resistivity smaller than the first resistivity. The second material 232 is along an edge of the first material 231, and is also disposed at an edge of the slit 235. The second material 234 is along an edge of the first material 233, and is also disposed at an edge of the slit 235.

Figure 3:
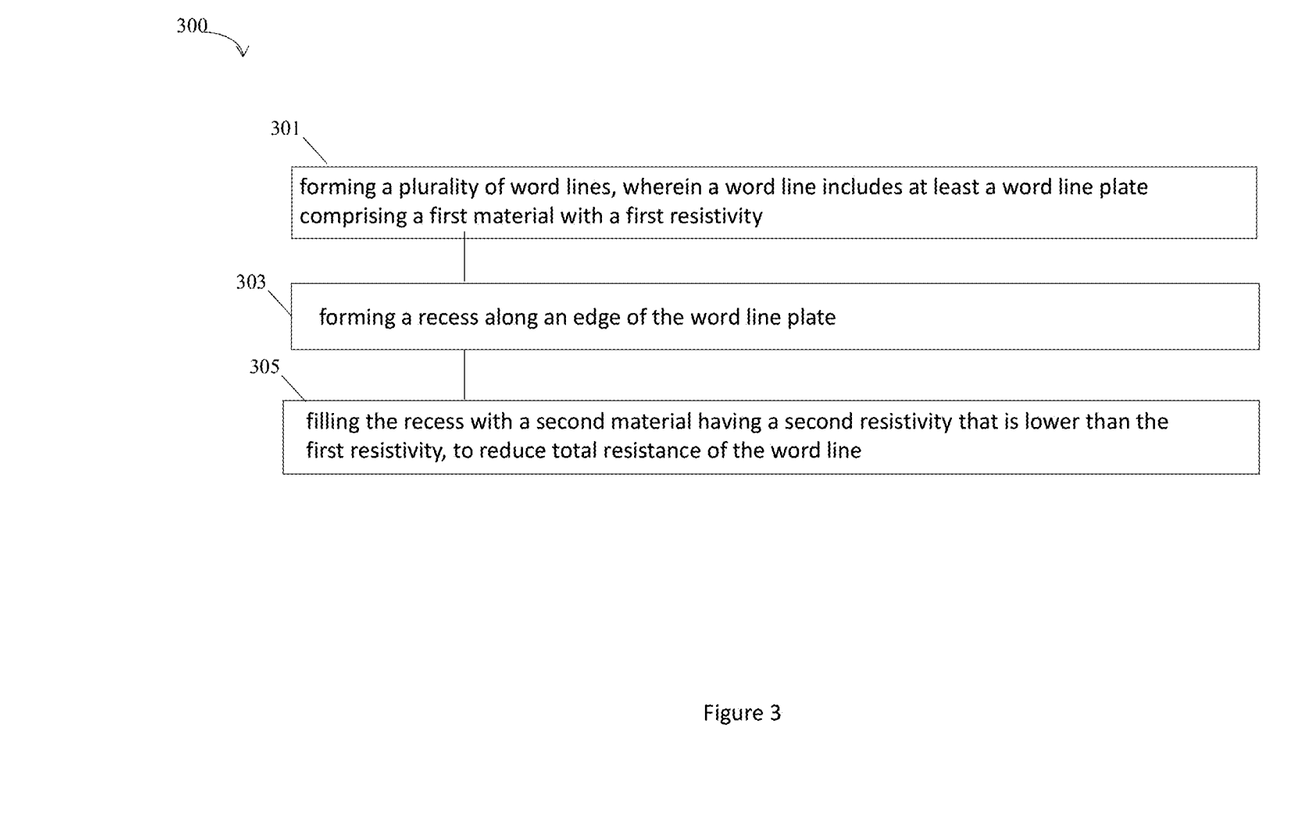
FIG. 3 illustrates an example process for making a memory array having a plurality of word lines, in accordance with various embodiments.

FIG. 3 illustrates an example process 300 for making a memory array having a plurality of word lines, in accordance with various embodiments. FIGS. 4(*a*)-4(*e*) illustrate another example process 400 for making a memory array having a plurality of word lines, in accordance with various embodiments. The process 300 or the process 400 may be used to form the memory array 100 as shown in FIG. 1(*a*), the memory array 200, the memory array 210, the memory array 220, and the memory array 230 as shown in FIGS. 2(*a*)-2(*d*). The process 400 may be an example of the process 300 with more details.

Figure 4A:
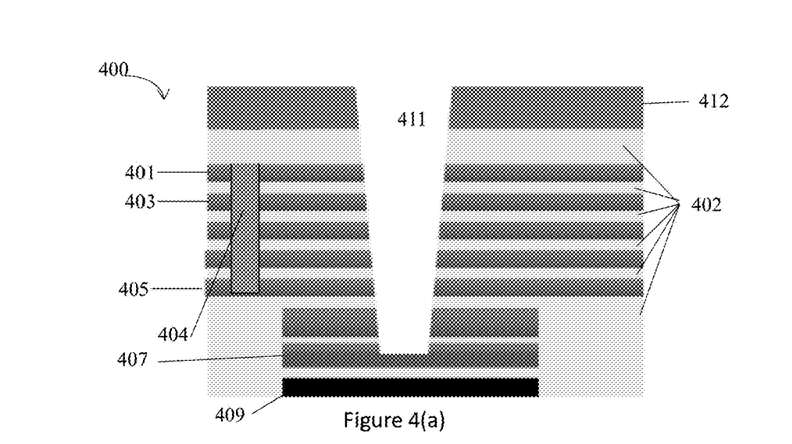
FIGS. 4(a)-4(e) illustrate another example process making a memory array having a plurality of word lines, in accordance with various embodiments.

The process 300 may start at a stage 301. During the stage 301, the process 300 includes forming a plurality of word lines, where a word line includes at least a word line plate comprising a first material with a first resistivity. For example, as shown in FIG. 4(*a*), the process 400 includes forming a plurality of word lines, e.g., a word line 401, a word line 403, a word line 405. The word line 401, the word line 403, or the word line 405, includes a first material with a first resistivity. In addition, the word line 401, the word line 403, and the word line 405 are formed above a source line 409 and a SGS transistor 407. Insulation layers 402 are formed below, between, and above the word lines. In addition, the process 400 includes forming a plurality of pillars, e.g., a pillar 404, disposed through the plurality of word lines. A pillar includes a number of storage cells formed at an intersection of the pillar and a word line. A storage cell includes a channel trapping layer surrounded by the word line, and a cell channel region surrounded by the channel trapping layer. Moreover, the process 400 includes forming a plurality of slits through the plurality of word lines, where a slit separates the plurality of word lines into a first word line region and a second word line region. In detail, a mask layer 412 is formed above the word lines and the insulation layers. An opening 411 is formed as a slit through the word lines, e.g., the word line 401, the word line 403, and the word line 405. In some embodiments, the opening 411 may be further through a part of the layers for the SGS transistor 407.

Figure 4B:
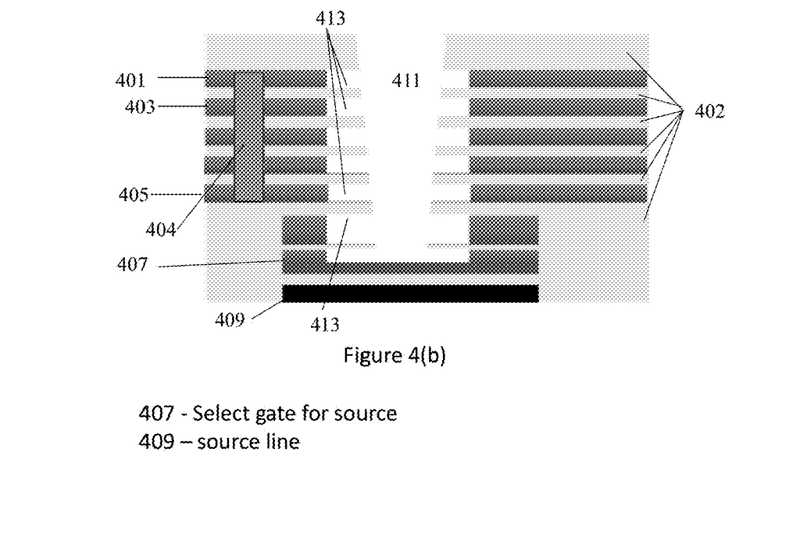

During a stage 303, the process 300 includes forming a recess along an edge of the word line plate. For example, as shown in FIG. 4(*b*), the process 400 includes forming a recess 413 along an edge of the word line plate, e.g., the word line 401, the word line 403, and the word line 404. In embodiments, forming the recess along the edge of the word line plate includes forming the recess along the slit, e.g., the opening 411.

Figure 4C:
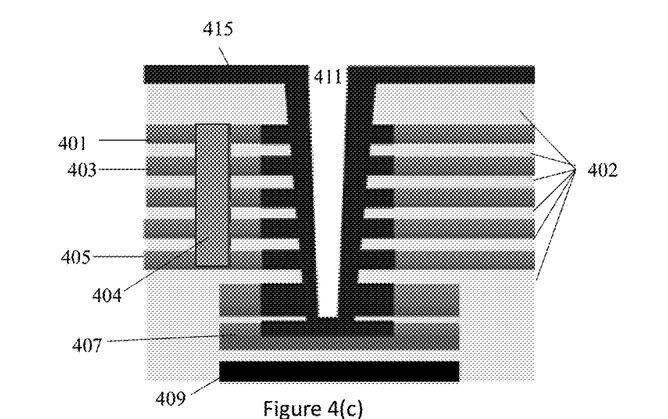
Figure 4D:
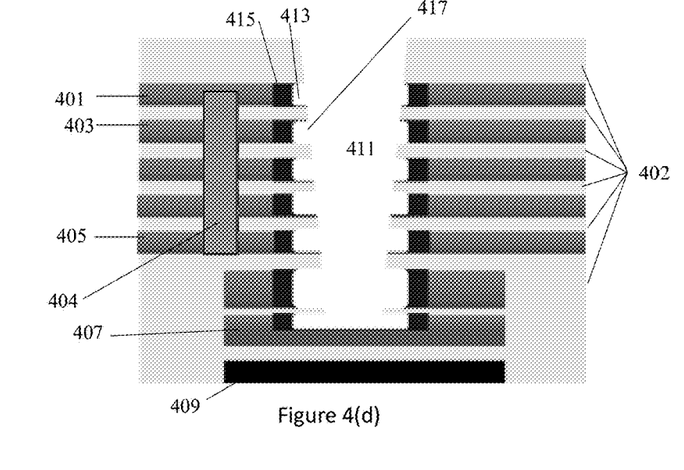
Figure 4E:
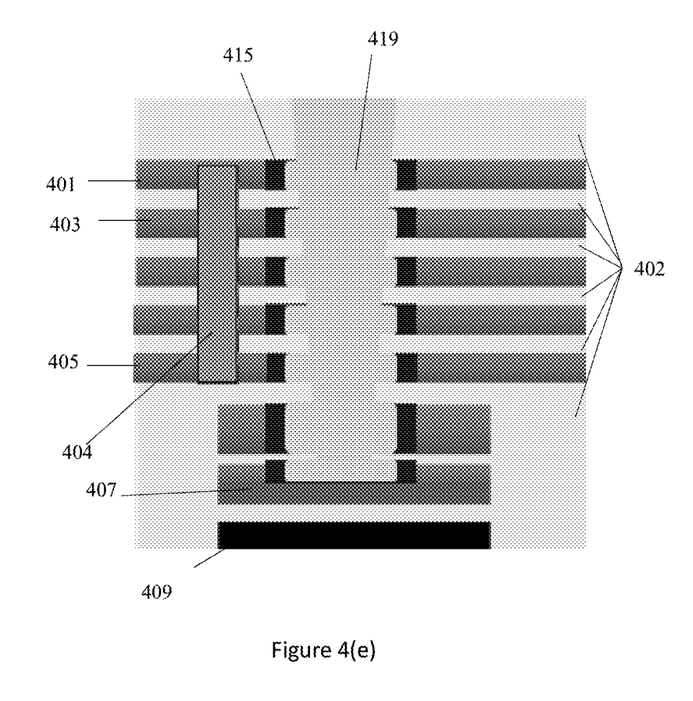

During a stage 305, the process 300 includes filling the recess with a second material having a second resistivity that is lower than the first resistivity, to reduce total resistance of the word line. For example, as shown in FIG. 4(*c*), the process 400 includes filling the recess 413 with a second material 415 having a second resistivity that is lower than the first resistivity. The second material 415 fills a part of the opening 411 as well, and conformally covers a top surface of the insulation layer 402.

In addition, as shown in FIG. 4(*d*), the process 400 may further include removing a part of the second material 415 from the opening 411, and may further include removing a part of the second material 415 from the recess 413. Moreover, as shown in FIG. 4(*e*), the process 400 includes filling the opening 411 and a part of the recess 413 by an insulating material 419, which becomes a slit splitting the word lines. In some other embodiments, the second material 415 may fill the entire recess 413, or even extend into a part of the opening 411.

Figure 5:
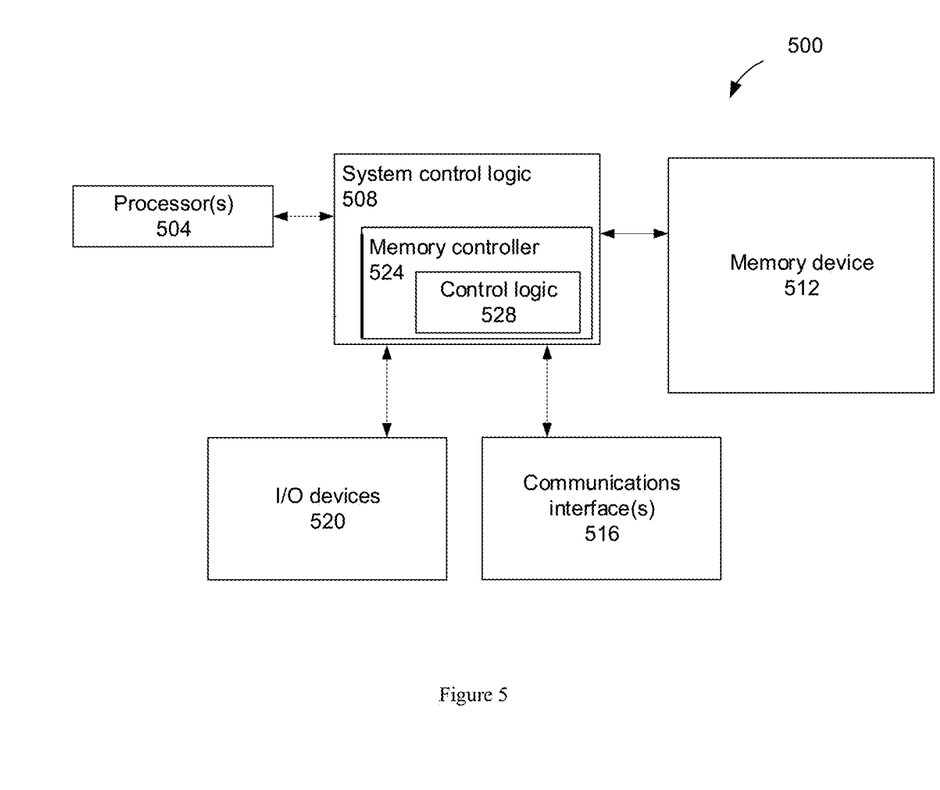
FIG. 5 illustrates an example computing device suitable for use to practice various aspects of the present disclosure, in accordance with various embodiments.

FIG. 5 illustrates an example computing device suitable for use to practice various aspects of the present disclosure, in accordance with various embodiments. The computing device 500 includes system control logic 508 coupled to one or more processor(s) 504, a memory device 512, one or more communications interface(s) 516, and input/output (I/O) devices 520.

The memory device 512 may be a non-volatile computer storage chip. In embodiments, the memory device 512 comprises a package, driver circuitry (e.g., drivers), input/output connections to electrically couple the memory device 512 with other components of the computing device 500, etc. The memory device 512 may be configured to be removably or permanently coupled with the computing device 500. In some embodiments, the memory device 512 may include a memory device similar to the memory array 100 as shown in FIG. 1(*a*), the memory array 200, the memory array 210, the memory array 220, and the memory array 230 as shown in FIGS. 2(*a*)-2(*d*), or a memory array formed according to the process 300 or the process 400.

Communications interface(s) 516 may provide an interface for computing device 500 to communicate over one or more network(s) and/or with any other suitable device. Communications interface(s) 516 may include any suitable hardware and/or firmware. Communications interface(s) 516 for one embodiment may include, for example, a network adapter, a wireless network adapter, a telephone modem, and/or a wireless modem. For wireless communications, communications interface(s) 516 for one embodiment may use one or more antennas to communicatively couple the computing device 500 with a wireless network.

For one embodiment, at least one of the processor(s) 504 may be packaged together with logic for one or more controller(s) of system control logic 508. For one embodiment, at least one of the processor(s) 504 may be packaged together with logic for one or more controllers of system control logic 508 to form a System in Package (SiP). For one embodiment, at least one of the processor(s) 504 may be integrated on the same die with logic for one or more controller(s) of system control logic 508. For one embodiment, at least one of the processor(s) 504 may be integrated on the same die with logic for one or more controller(s) of system control logic 508 to form a System on Chip (SoC).

System control logic 508 for one embodiment may include any suitable interface controllers to provide for any suitable interface to at least one of the processor(s) 504 and/or to any suitable device or component in communication with system control logic 508. The system control logic 508 may move data into and/or out of the various components of the computing device 500.

System control logic 508 for one embodiment may include a memory controller 524 configured to provide an interface to the memory device 512, to control various memory access operations. The memory controller 524 may include control logic 528 that may be specifically configured to control access of the memory device 512.

In various embodiments, the I/O devices 520 may include user interfaces designed to enable user interaction with the computing device 500, peripheral component interfaces designed to enable peripheral component interaction with the computing device 500, and/or sensors designed to determine environmental conditions and/or location information related to the computing device 500.

In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard.

In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 516 to communicate with components of a positioning network, e.g., a global positioning system (GPS) satellite.

In various embodiments, the computing device 500 may be a server; a laptop computing device, a tablet computing device, a netbook, a smartphone, etc.; a desktop computing device; a workstation; etc. The computing device 500 may have more or fewer components, and/or different architectures. In further implementations, the computing device 500 may be any other electronic device that processes data.

Figure 6:
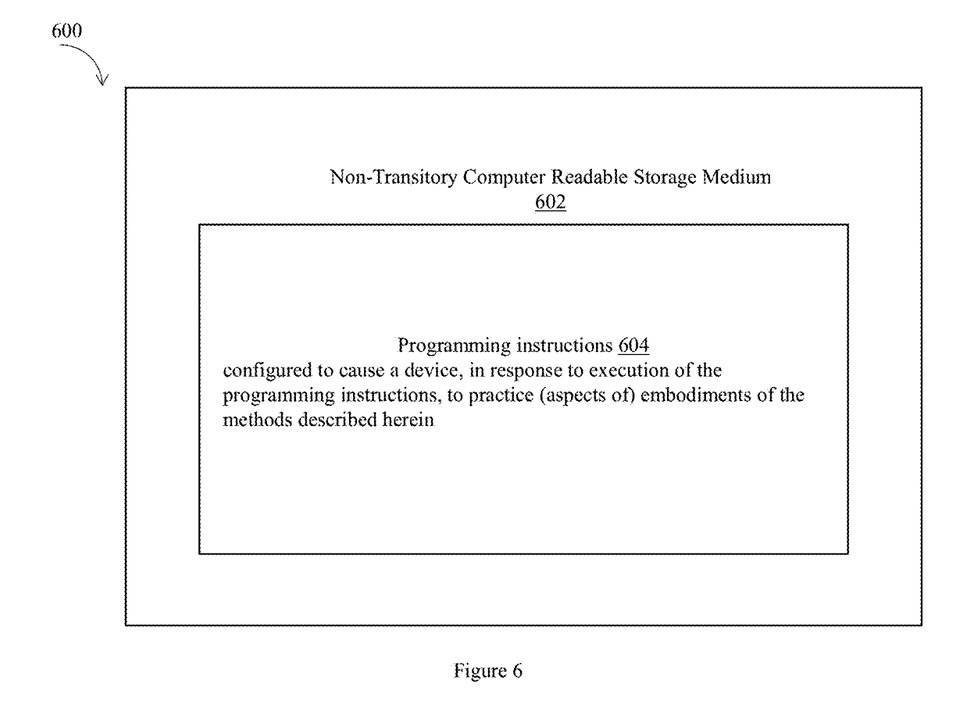
FIG. 6 illustrates a storage medium having instructions for practicing methods described with references to FIGS. 1-5, in accordance with various embodiments.

FIG. 6 illustrates a storage medium having instructions for practicing methods described with references to FIGS. 1-5, in accordance with various embodiments. The instructions 604 stored on the computing device-readable storage medium 602. More specifically, the computing device-readable storage medium 602 may include a memory device similar to the memory array 100 as shown in FIG. 1(*a*), the memory array 200, the memory array 210, the memory array 220, and the memory array 230 as shown in FIGS. 2(*a*)-2(*d*), or a memory array formed according to the process 300 or the process 400. The instructions stored on the computing device-readable storage medium 602 may be executed, for example, on the processor(s) 504 of the computing device 500 of FIG. 5. The computing device-readable storage medium 602 may be implemented in, or be accessible by, the control logic 528 of FIG. 5.

As illustrated, computing device-readable storage medium 602 may include the executable code of a number of programming instructions or bit streams 604. Executable code of programming instructions (or bit streams) 604 may be configured to enable a device, e.g., computing device 600, in response to execution of the executable code/programming instructions to perform (aspects of) processes, e.g., the process 300 or the process 400. In alternate embodiments, executable code/programming instructions/bit streams 604 may be disposed on multiple non-transitory computing device-readable storage media 602 instead. In embodiments, computing device-readable storage medium 602 may be non-transitory. In still other embodiments, executable code/programming instructions 604 may be encoded in a transitory computer readable medium, such as signals.

Thus various example embodiments of the present disclosure have been described including, but are not limited to:

Example 1 may include an apparatus comprising: a memory array including a plurality of word lines, wherein a word line includes at least one word line plate, wherein the word line plate comprises a first material with a first resistivity, wherein an edge of the word line plate is recessed and filled with a second material having a second resistivity that is lower than the first resistivity, to reduce total resistance of the word line.

Example 2 may include the apparatus of example 1 and/or some other examples herein, wherein the first material includes polysilicon, and the second material includes a metal.

Example 3 may include the apparatus of example 1 and/or some other examples herein, wherein memory array further includes a plurality of pillars disposed through the plurality of word lines, wherein a pillar includes a number of storage cells, a storage cell includes a channel trapping layer surrounded by the word line, and a cell channel region surrounded by the channel trapping layer.

Example 4 may include the apparatus of example 3 and/or some other examples herein, wherein the storage cell includes a floating gate transistor.

Example 5 may include the apparatus of example 3 and/or some other examples herein, wherein the channel trapping layer includes an Oxide-Nitride-Oxide (ONO) material.

Example 6 may include the apparatus of example 3 and/or some other examples herein, wherein the storage cell further includes an oxide material surrounded by the cell channel region.

Example 7 may include the apparatus of example 3 and/or some other examples herein, wherein the memory array further includes a plurality of slits through the plurality of word lines, and wherein a slit separates the plurality of word lines into a first word line region and a second word line region, and storage cells within the first word line region forms a first memory block, and storage cells within the second word line region forms a second memory block.

Example 8 may include the apparatus of example 7 and/or some other examples herein, wherein the slit is filled with an insulating material.

Example 9 may include the apparatus of example 3 and/or some other examples herein, wherein the memory array further includes a source side select (SGS) transistor or a drain side select (SGD) transistor above or below the plurality of the word lines.

Example 10 may include the apparatus of example 3 and/or some other examples herein, wherein the memory array further includes a plurality of bit lines coupled to the plurality of pillars in a direction orthogonal to the plurality of word lines and the plurality of pillars.

Example 11 may include a method for forming a memory array, the method comprising: forming a plurality of word lines, wherein a word line includes at least a word line plate comprising a first material with a first resistivity; forming a recess along an edge of the word line plate; and filling the recess with a second material having a second resistivity that is lower than the first resistivity, to reduce total resistance of the word line.

Example 12 may include the method of example 11 and/or some other examples herein, wherein the first material includes polysilicon, and the second material includes a metal.

Example 13 may include the method of example 11 and/or some other examples herein, further comprises: forming a plurality of pillars disposed through the plurality of word lines, wherein a pillar includes a number of storage cells, a storage cell includes a channel trapping layer surrounded by the word line, and a cell channel region surrounded by the channel trapping layer.

Example 14 may include the method of example 11 and/or some other examples herein, further comprises: forming one or more dummy pillars disposed through the plurality of word lines, wherein a dummy pillar does not include a storage cell.

Example 15 may include the method of example 11 and/or some other examples herein, further comprising: forming a plurality of slits through the plurality of word lines, wherein a slit separates the plurality of word lines into a first word line region and a second word line region, and wherein the forming the recess along the edge of the word line plate includes forming the recess along the slit.

Example 16 may include the method of example 15 and/or some other examples herein, wherein the second material filling the recess along the edge of the word line plate is also disposed along an edge of the slit.

Example 17 may include a computing device, comprising: one or more processors; and a memory array coupled to the one or more processors, wherein the memory array includes a plurality of word lines, wherein a word line includes at least one word line plate, wherein the word line plate comprises a first material with a first resistivity, wherein an edge of the word line plate is recessed and filled with a second material having a second resistivity that is lower than the first resistivity, to reduce total resistance of the word line.

Example 18 may include the computing device of example 17 and/or some other examples herein, wherein the memory array is a three dimensional double density flash memory.

Example 19 may include the computing device of example 17 and/or some other examples herein, wherein the first material includes polysilicon, and the second material includes a metal; and wherein the memory array further includes a plurality of pillars disposed through the plurality of word lines, wherein a pillar includes a number of storage cells, a storage cell includes a channel trapping layer surrounded by the word line, and a cell channel region surrounded by the channel trapping layer.

Example 20 may include the computing device of example 19 and/or some other examples herein, wherein the memory array further includes a plurality of slits through the plurality of word lines, and wherein a slit separates the plurality of word lines into a first word line region and a second word line region, and storage cells within the first word line region forms a first memory block, and storage cells within the second word line region forms a second memory block.

Although certain embodiments have been illustrated and described herein for purposes of description this application is intended to cover any adaptations or variations of the embodiments discussed herein. Therefore, it is manifestly intended that embodiments described herein be limited only by the claims.

What is claimed is:

1. An apparatus comprising:
a plurality of word lines of a memory array, wherein a word line includes a first word line plate and a second word line plate that are co-planar with one another and separated from one another by a slit such that the first word line plate is not directly physically coupled with the second word line plate, wherein the first word line plate forms a substantially rectangular shape that extends in an X direction and comprises a first material with a first resistivity, wherein an edge of the rectangular shape of the first word line plate is recessed and filled with a second material that has a second resistivity that is lower than the first resistivity to reduce total resistance of the first word line plate, wherein the first material is in direct physical contact with the second material and wherein the slit is filled with an insulating material that is in direct contact with the second material; and
a plurality of pillars disposed to intersect with the plurality of word lines in a Y direction that is orthogonal to the X direction in which the first word line plate forms the substantially rectangular shape, wherein a pillar of the plurality of pillars is in direct physical contact with the first material with the first resistivity of the first word line plate at an intersection of the pillar with the first word line plate.

2. The apparatus of claim 1, wherein the first material includes polysilicon, and the second material includes a metal.

3. The apparatus of claim 1, wherein the pillar of the plurality of pillars includes a number of storage cells, a storage cell includes a channel trapping layer surrounded by the word line, and a cell channel region surrounded by the channel trapping layer.

4. The apparatus of claim 3, wherein the storage cell includes a floating gate transistor.

5. The apparatus of claim 3, wherein the channel trapping layer includes an Oxide-Nitride-Oxide (ONO) material.

6. The apparatus of claim 3, wherein the storage cell further includes an oxide material surrounded by the cell channel region.

7. The apparatus of claim 1, wherein the memory array further includes a plurality of slits through the plurality of word lines, and wherein storage cells within the first word line plate form a first memory block, and storage cells within the second word line plate form a second memory block.

8. The apparatus of claim 1, wherein the memory array further includes a source side select (SGS) transistor or a drain side select (SGD) transistor above or below the plurality of word lines.

9. The apparatus of claim 1, wherein the memory array further includes a plurality of bit lines coupled to the plurality of pillars in a direction orthogonal to the plurality of word lines and the plurality of pillars.

10. A method for forming a memory array, the method comprising:

forming a plurality of word lines, wherein a word line includes a first word line plate and a second word line plate that are co-planar with one another and separated from one another by a slit such that the first word line plate is not directly physically coupled with the second word line plate, wherein the first word line plate includes a first material with a first resistivity, and the first word line plate forms a substantially rectangular shape that extends in an X direction;

forming a recess along an edge of the first word line plate;

filling the recess with a second material that has a second resistivity that is lower than the first resistivity to reduce total resistance of the word line, wherein the first material of the first word line plate is in direct physical contact with the second material of the first word line plate;

filling the slit with an insulating material that is in direct contact with the second material of the first word line plate; and disposing a plurality of pillars to intersect with the plurality of word lines in a Y direction that is orthogonal to the X direction in which the first word line plate forms the substantially rectangular shape, wherein a pillar of the plurality of pillars is in direct physical contact with the first material at an intersection of the pillar with the first word line plate.

11. The method of claim 10, wherein the first material includes polysilicon, and the second material includes a metal.

12. The method of claim 10, wherein the pillar of the plurality of pillars includes a number of storage cells, a storage cell includes a channel trapping layer surrounded by the word line, and a cell channel region surrounded by the channel trapping layer.

13. The method of claim 10, further comprising:
forming one or more dummy pillars disposed through the plurality of word lines, wherein a dummy pillar does not include a storage cell.

14. The method of claim 10, forming a plurality of slits through the plurality of word lines, wherein a slit of the plurality of slits separates the plurality of word lines into a first word line region and a second word line region, and wherein forming the recess along the edge of the first word line plate includes forming the recess along the slit.

15. The method of claim 10, wherein the second material filling the recess along the edge of the first word line plate is also disposed along an edge of the slit.

16. A computing device, comprising:
one or more processors; and
a memory array coupled to the one or more processors, wherein the memory array includes:
a plurality of word lines, wherein a word line includes a first word line plate and a second word line plate that are co-planar with one another and separated from one another by a slit such that the first word line plate is not directly physically coupled with the second word line plate, wherein the first word line plate has a substantially rectangular shape that extends in an X direction, wherein the first word line plate includes a first material with a first resistivity, wherein an edge of the first word line plate is recessed and filled with a second material that has a second resistivity that is lower than the first resistivity to reduce total resistance of the word line, wherein the first material is in direct physical contact with the second material, and wherein the slit is filled with an insulating material that is in direct contact with the second material; and
wherein the memory array further includes a plurality of pillars disposed to intersect with the plurality of word lines in a Y direction that is orthogonal to the X direction in which the first word line plate forms the substantially rectangular shape, wherein a pillar of the plurality of pillars is in direct physical contact with the first material at an intersection of the pillar with the first word line plate.

17. The computing device of claim 16, wherein the memory array is a three dimensional double density flash memory.

18. The computing device of claim 16, wherein the first material includes polysilicon, and the second material includes a metal; and wherein the pillar of the plurality of pillars includes a number of storage cells, wherein a storage cell includes a channel trapping layer surrounded by the word line, and a cell channel region surrounded by the channel trapping layer.

19. The computing device of claim 18, wherein storage cells within the first word line plate form a first memory block, and storage cells within the second word line plate form a second memory block.

* * * * *